United States Patent
Nishimura et al.

[11] Patent Number: 6,166,408
[45] Date of Patent: Dec. 26, 2000

[54] HEXAGONALLY SYMMETRIC INTEGRATED CIRCUIT CELL

[75] Inventors: Akitoshi Nishimura, Tsuchiura; Yasutoshi Okuno, Tsukuba, both of Japan; Rajesh Khamankar, Irving; Shane R. Palmer, Dallas, both of Tex.

[73] Assignee: Texas Instruments Incorporated, Dallas, Tex.

[21] Appl. No.: 09/216,251

[22] Filed: Dec. 18, 1998

Related U.S. Application Data

[60] Provisional application No. 60/070,297, Dec. 31, 1997.

[51] Int. Cl.[7] .................................................. H01L 27/108
[52] U.S. Cl. ............................................ 257/306; 257/905
[58] Field of Search ................................. 257/296–313, 257/905

[56] References Cited

U.S. PATENT DOCUMENTS

| | | | |
|---|---|---|---|
| 5,789,770 | 8/1998 | Rostoker et al. | 257/365 |
| 5,998,256 | 12/1999 | Juengling | 438/253 |

*Primary Examiner*—David Hardy
*Attorney, Agent, or Firm*—Jacqueline J. Garner; Wade James Brady III; Frederick J. Telecky, Jr.

[57] ABSTRACT

An apparatus and method for fabrication a hexagonally symmetric cell, (e.g., a dynamic random access memory cell (100)). The cell can comprise a bitline contact (38), storage node contacts (32) hexagonally surrounding the bitline contact (38), storage nodes (36) also surrounding the bitline contact (38), a wordline (30) portions of which form field effect transistor gates. Large distances between bitline contacts (38) and storage node contacts (32) cause large problems during photolithography because dark areas are difficult to achieve when using Levenson Phaseshift. Because Levenson Phaseshift depends on wave cancellations between nearby features, commonly known as destructive interferences, the resultant printability of the pattern is largely a function of the symmetry and separation distances. When non-symmetries in the pattern occur, the result is weaker cancellations of fields (i.e. between features) and a large loss of image contrast and depth of focus during the printing step. The net result are defects, which increase device failure, can be significantly reduced by the geometry modifications disclosed herein.

17 Claims, 5 Drawing Sheets

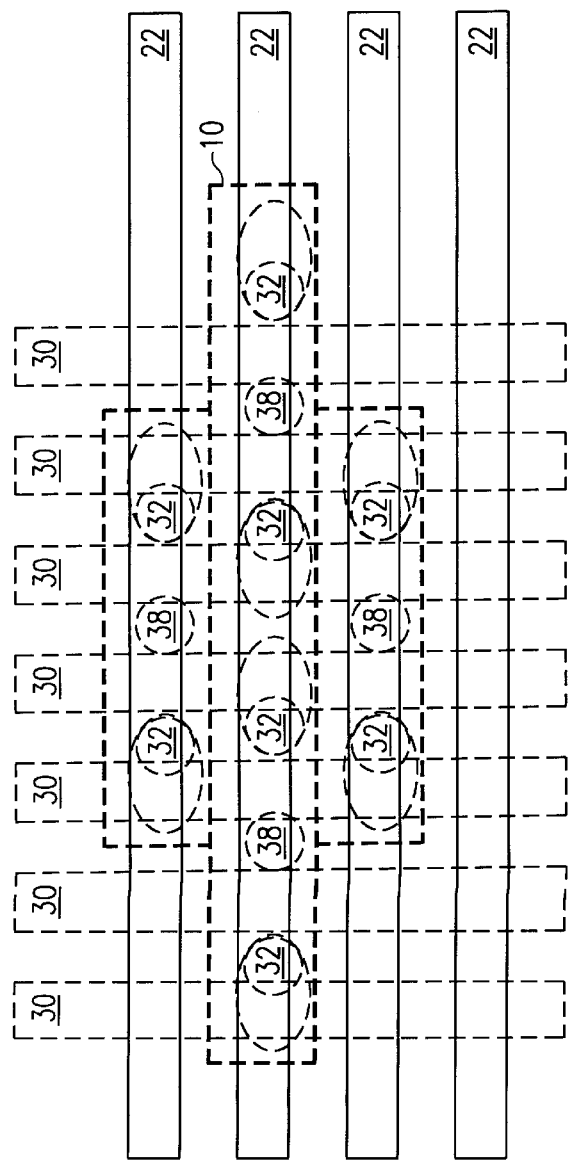
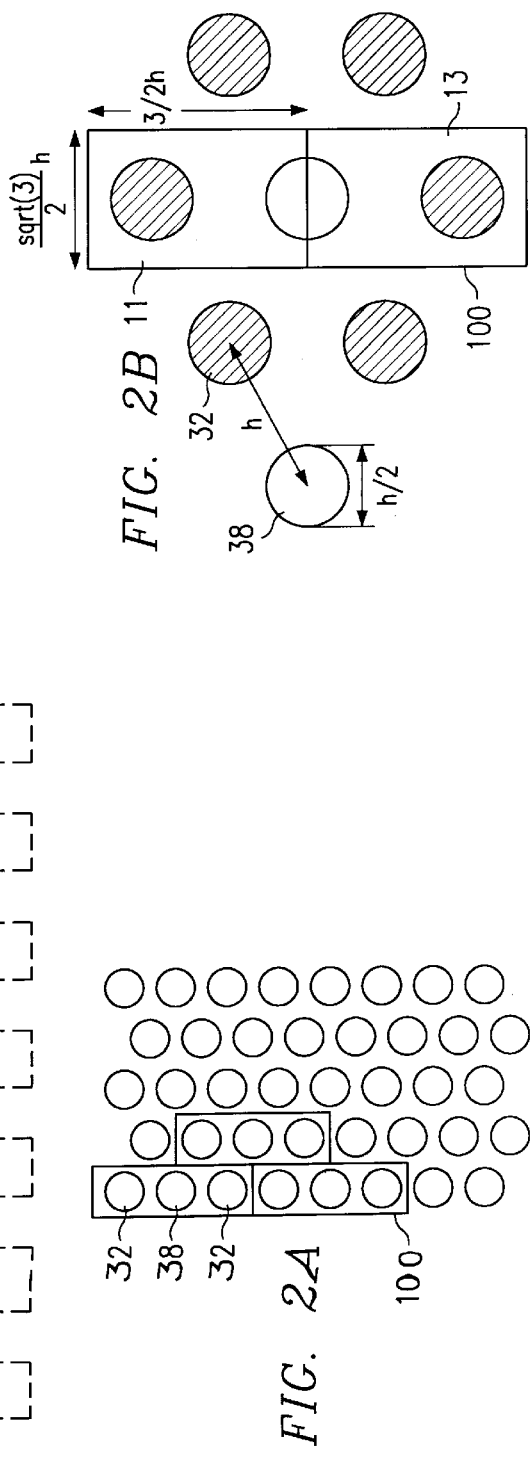

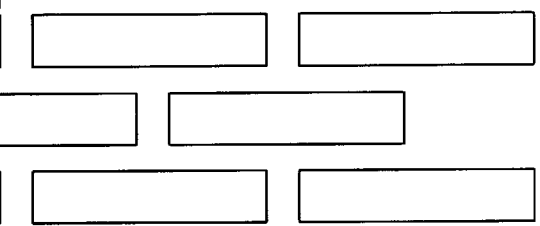
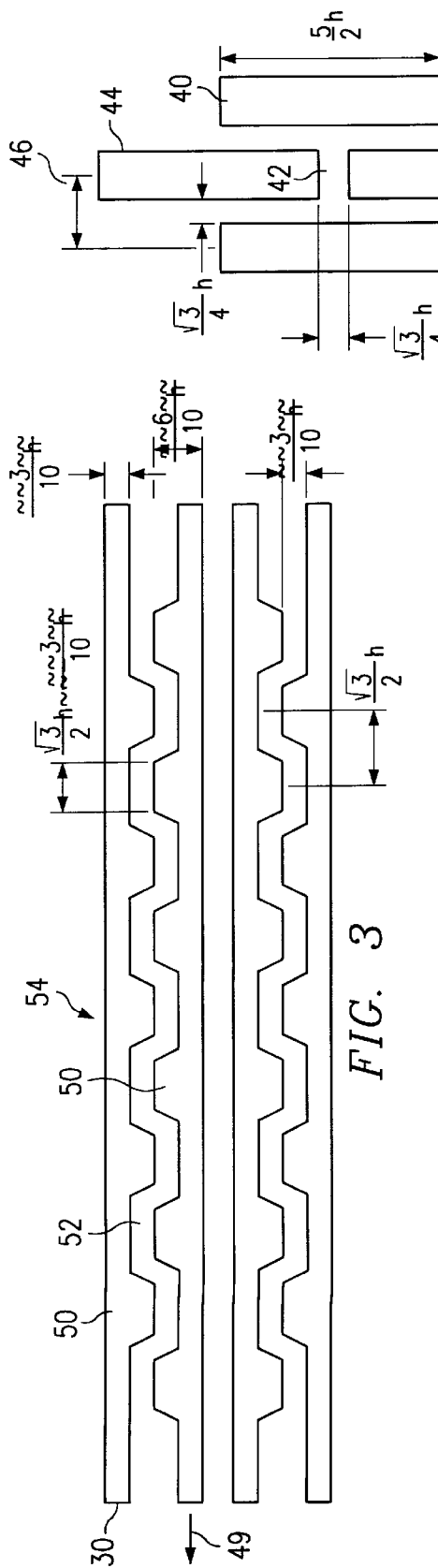
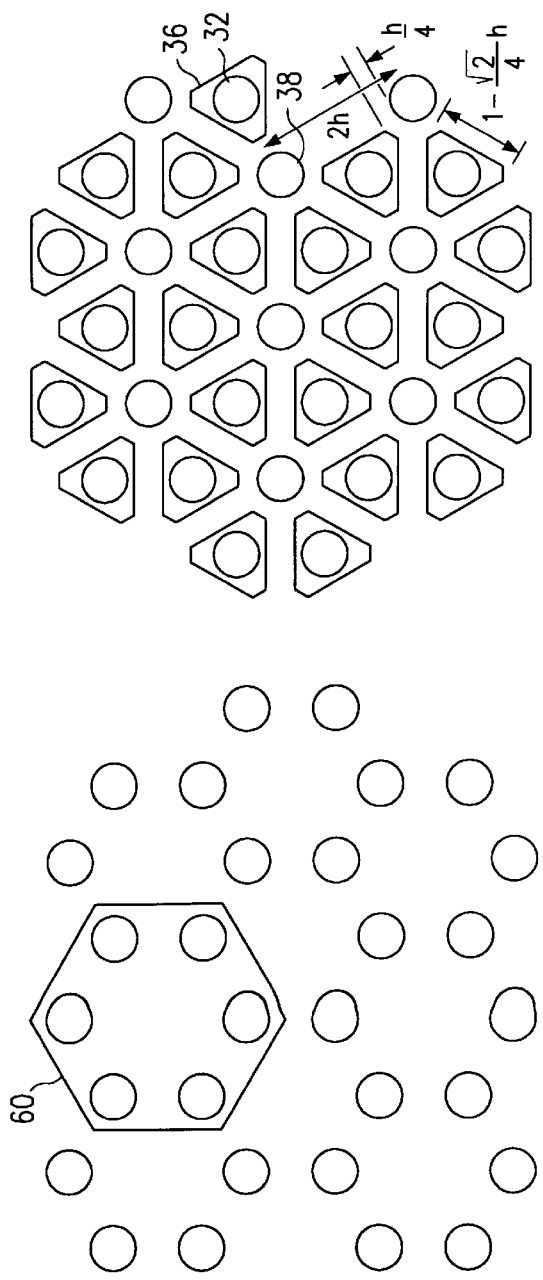
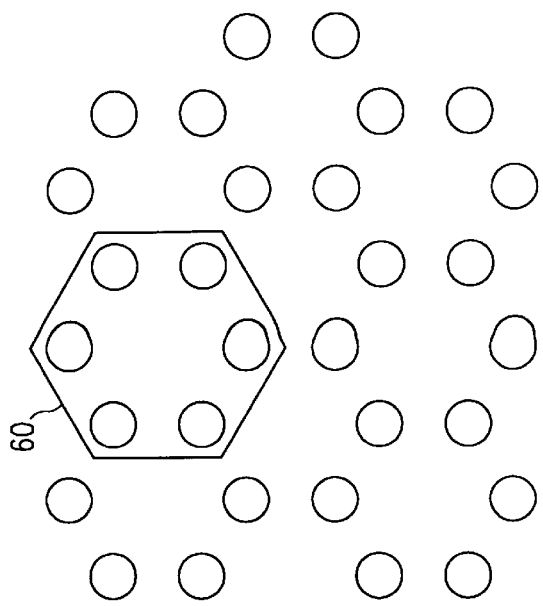

HEXAGONALLY SYMMETRIC INTEGRATED CIRCUIT CELL

CROSS REFERENCE TO PRIOR APPLICATIONS

This application claims priority under 35 U.S.C. 119(e) based upon Provisional Application Ser. No. 60/070,297, filed Dec. 31, 1997.

TECHNICAL FIELD OF THE INVENTION

The present invention relates in general to the field of integrated circuits, and more particularly, to circuits such as a dynamic random access memory cell and a method of manufacturing the same.

BACKGROUND OF THE INVENTION

Without limiting the scope of the invention, its background is described in connection with dynamic random access memory (DRAM) cells, as an example.

As is well known in the art of integrated circuit design, layout and fabrication, the manufacturing cost of a given integrated circuit is largely dependent upon the chip area required to implement desired functions. The chip area is defined by the geometries and sizes of the active components disposed in the wafer substrate. Active components include gate electrodes in metal-oxide semiconductors (MOS) and diffused regions such as MOS source and drain regions and bipolar emitters, collectors and base regions. These geometries and sizes are often dependent upon the photolithographic resolution available for the particular equipment used for processing the integrated circuit.

A significant problem of current photolithographic techniques as applied to very-large-scale integration (VLSI) as more and more layers are added, is that additional steps add additional complexity to the creation of circuits on the wafer surface. The resolution of small image sizes in photolithography becomes more difficult due to light reflection and the thinning of the photoresist during processing.

As a two dimensional process used to achieve a three dimensional structure, the goal of photolithographic patterning is to establish the horizontal and vertical dimensions of the various devices and circuits used to create a pattern that meets design requirements, such as, the correct alignment of circuit patterns on the wafer surface. As line widths shrink, photolithography of patterns down to the nanometer level and smaller approach the limits of resolution of present equipment. These nanometer width lines become increasingly more difficult to pattern because of the need to isolate the integrated circuit components.

A DRAM cell consists of a transistor and a capacitor. A bitline and a wordline are connected to one of the transistor source/drain and its gate, with the other source/drain being connected to the capacitor. As the density of DRAM cells on a silicon chip increases, DRAM cells having three dimensional structures, such as stacked capacitors, have been developed to meet the increased need for miniaturization. The use of stacked three dimensional structures, for example, allows the DRAM designer to maximize the capacitance of storage nodes within the limited area of the DRAM cell.

SUMMARY OF THE INVENTION

What is needed is a structure and method for using current integrated circuit processing techniques and manufacturing equipment that meet the demands of VLSI integrated circuits. Also needed, is an improvement in the design of masking patterns that can be used with laser-based step lithography that provides the isolation required for DRAM cell production. These masking and DRAM cell designs must conform to current equipment and manufacturing techniques, and at the same time, provide the required increase in DRAM chip capacity.

Large distances between bitline contacts and storage node contacts cause large problems during photolithography because dark areas are difficult to achieve when using Levenson Phaseshift. Because Levenson Phaseshift depends on wave cancellations between nearby features, commonly known as destructive interferences, the resultant printability of the pattern is largely a function of the symmetry and separation distances. When non-symmetries in the pattern occur, the result is weaker cancellations of fields (i.e. between features) and a large loss of image contrast and depth of focus during the printing step. The net result are defects, which increase device failure, which can be significantly reduced by the geometry modifications disclosed herein.

The present invention is directed to a DRAM circuit comprising, a first source/drain and a bitline electrically connected to the first source/drain by a bitline contact. At least six storage node contacts are hexagonally disposed surrounding the bitline contact. The at least six storage nodes are electrically connected to a second source/drain by at least six storage node contacts. In one embodiment the DRAM circuit further comprises a wordline electrically connected to a field effect transistor, the wordline being disposed at an angle to the bitline.

In one embodiment the area covered by an individual DRAM cell is calculated by the formula:

$$\tfrac{3}{4}\sqrt{3} \times h \times h = 8f^2$$

where f is a design rule value and h is the closest distance between a storage node contact and a bitline contact. The diameter of said bitline can be h/2, as can be the diameter of said storage node contact is h/2. The wordline for use with the invention can comprise a centerline extending through the wordline and protrusions that extend from the centerline to form the transistor gate. The protrusions of the wordline can have an area calculated by the formula:

$$\sqrt{3}/2 * h - \tfrac{3}{10} * h = \text{area}$$

wherein h is the closest distance between, e.g., a storage node contacts and a bitline contact.

The storage node can have an area defined by the following formula:

$$(6 - 3\sqrt{3}/2)ht + \sqrt{3}/4(1 - \sqrt{3}/4)^2 h^2$$

wherein h is the closest distance between, e.g., a storage node contacts and a bitline contact, and t is the dielectric constant for a capacitor.

The present invention is also directed to a method for fabricating DRAM cells on a silicon wafer comprising the steps of simultaneously forming six storage node contacts disposed surrounding a bitline contact, disposing a wordline to form at least one field effect transistor gate, forming six storage nodes surrounding a bitline in a hexagonal manner, contacting each of the storage nodes with a storage node contact and forming a capacitor with the storage node contacts.

In yet another embodiment, a method of fabricating an integrated circuit is provided comprising simultaneously forming at least seven hexagonally arranged via contacts, the lower end of two of the via contacts electrically connect to first and second circuit elements. In one embodiment, the first type of circuit element is a first source/drain of a transistor. In another embodiment, the second type of circuit element is a second source/drain of the transistor. Alternatively, the second type of circuit element is the gate of a transistor.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 1C is a top view of a group of standard $8f^2$ DRAM cells as arranged in the prior art;

FIG. 2A is a top view of the self-aligning contacts that form a part of DRAM cells arranged according to the present invention;

FIG. 2B is a close-up top view of the hexagonal DRAM cell arrangement;

FIG. 3 is a top view of the wordline design and pattern for DRAM cells;

FIG. 4 is a top view of the moat design for a DRAM cells;

FIG. 5 is a top view of the hexagonally arranged storage node contacts in isolation;

FIG. 6 is a top view of the storage nodes, storage node contacts and the bitline contacts for DRAM cells;

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1A:
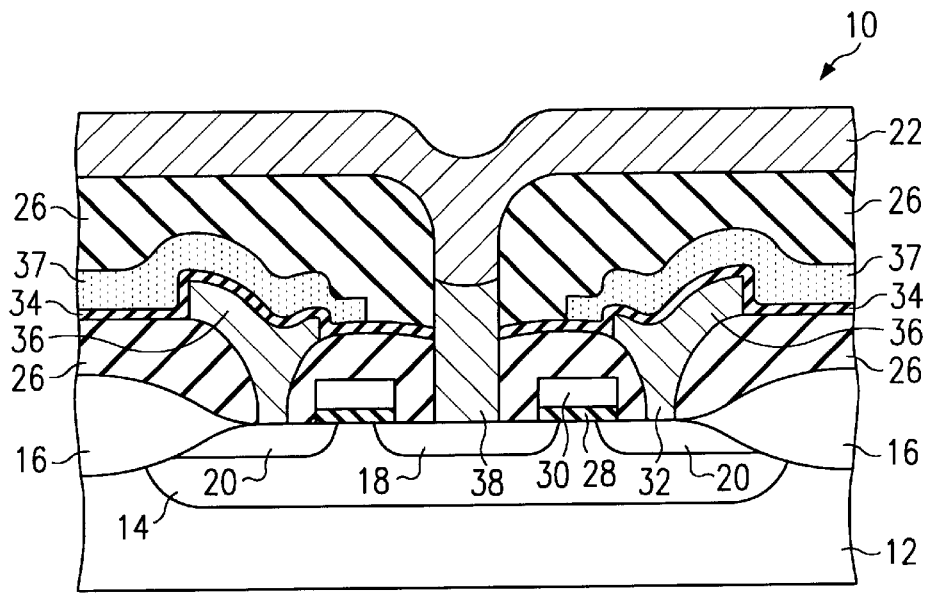
FIG. 1A is a cross-sectional view of a DRAM cell.

The general features of a pair of prior art DRAM cells generally designated as 10 are shown as a cross-sectional view in FIG. 1A. DRAM cells 10 have a substrate 12 that is formed having a conductivity type which is one of either a P-type conductivity or a N-type conductivity, if the substrate 12 is silicon based. Substrate 12 may be made of silicon, gallium arsenide, silicon on insulator (SOI) structures, epitaxial formations, germanium, germanium silicon, polysilicon, amorphous silicon, and/or like substrate, semi-conductive or conductive. The substrate 12 is typically made of single crystal silicon, and is usually lightly doped with boron, phosphorous or arsenic atoms.

A moat or active area region 14 is shown disposed within a field oxide region 16 which has been grown from substrate 12 if the substrate 12 is silicon based. The moat region 14, generally formed by diffusion, has disposed therein conductive source/drain regions 20. The common source/drain 18 (common to both cells), located within moat 14, is connected to bitline contact 38 that is etched through an insulating layer 26.

Disposed adjacent to the conductive regions 20, and the common source/drain 18, are a gate oxides 28 and wordlines 30. Portions of the wordlines 30 also function as gates, which define the field effect transistors (FET) of the DRAM cells 10. The storage nodes 36 (lower plates of the capacitors) of the DRAM cells 10 are electrically connected to the conductive regions 20 by storage node contact 32. A storage node 36, dielectric layer 34 disposed over the storage node 36 and grounded upper plate 37 form the capacitor. The various components of the DRAM cell 10 are electrically isolated by insulating layers 26.

Figure 1B:
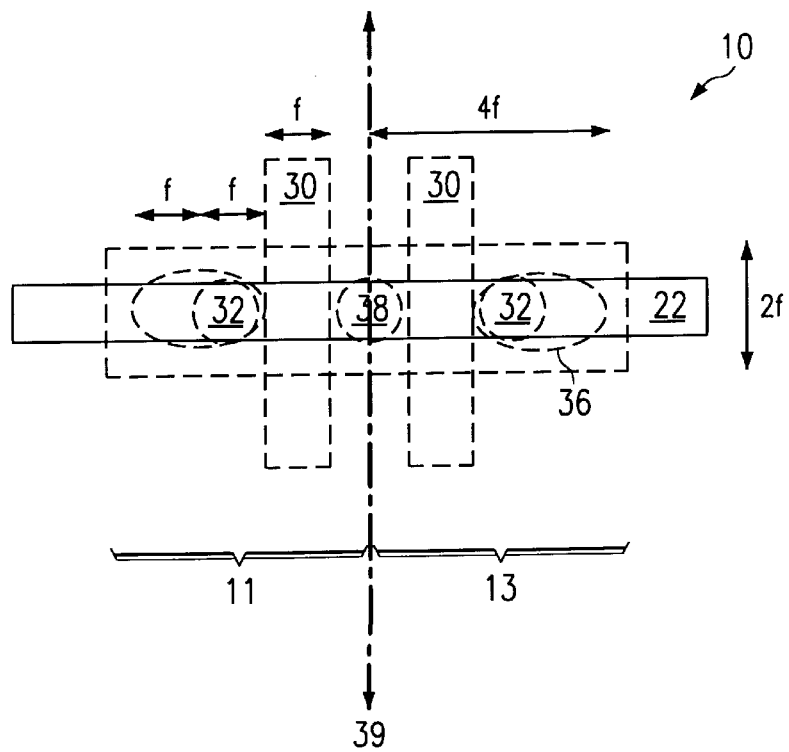
FIG. 1B is a top view of a pair of DRAM cells of the prior art using standard $8f^2$ geometry.

FIG. 1B is a top view of the design layout of a pair of prior art DRAM cells 10. Divided across centerline 39 are two $8f^2$ sized cells 11, 13 that define the DRAM cells 10. As best viewed in conjunction with FIG. 1A, a bitline contact 38 is disposed spanning one-half of one f unit across both $8f^2$ cells 11 and 13 of the DRAM cells 10. Bitline contact 38 is centrally located over the common source/drain 18. Located at a distance of one f unit on either side of bitline contact 38 are storage node contacts 32, which contact storage node 36 through conductive regions 20 to connect to the capacitor which is above the wordlines 30 and the storage node contacts 32. Wordlines 30 have a width of one f unit, which is generally the same as the diameter of the storage node contacts 32. Perpendicular to the wordlines 30 is a bitline 22 that is depicted atop the units 11 and 13 and which forms an electrical contact with bitline contact 38. Bitline 22 also has a width of one f unit and is longitudinally centered over the DRAM unit cell 10.

FIG. 1C shows a simplified layout of four pair DRAM unit cells 10 of the prior art from a top view. The DRAM unit cells 10 in FIG. 1C are the same as the DRAM unit cells 10 in FIG. 13 and can be seen aligned as the wordlines 30 and bitlines 22 traverse multiple units. Following the standard rectangular $8f^2$ design rule along centerline 39, the positioning of bitline contacts 38 relative to each other and of storage node contacts 32 relative to each other, are best viewed in plan view. As is apparent from the top view, the bitline contacts 38 are disposed at a minimum distance of three to three and a half f units when measured horizontally, vertically, or diagonally. The top view highlights the large gaps that exist between storage node contacts 22, for example, a distance of up to three f units. These large distances between bitline contacts 38 and storage node contacts 32 (collectively, self aligning contacts (SAC)), cause large problems during photolithography because dark areas are difficult to achieve when using Levenson Phaseshift.

Large distances between bitline contacts and storage node contacts cause large problems during photolithography because dark areas are difficult to achieve when using Levenson Phaseshift. Because Levenson Phaseshift depends on wave cancellations between nearby features, commonly known as destructive interferences, the resultant printability of the pattern is largely a function of the symmetry and separation distances. When non-symmetries in the pattern occur, the result is weaker cancellations of fields (i.e. between features) and a large loss of image contrast and depth of focus during the printing step. The net result are defects, which increase device failure, which can be significantly reduced by the geometry modifications disclosed herein.

The present invention generally follows the design rule for cell design and isolation following the typical design rules for cells, such as, 8f²-based cells. The present invention also generally follows the design and processing rules when viewing the cell in a cross-sectional manner. The present invention, however, departs from conventional cell design in order to achieve the improvements necessary to reduce the design rule and wiring design patterns for use with current lithographic equipment. Lithographic machines having a light source with a wavelength of, for example, 248 nanometers for a KrF laser can be used to create the design patterns required for cells using an f value of 0.16 or 0.13 micrometers. This is only true, however, for strong phase shift under "ideal" conditions.

Using the present invention, cells having a design pattern of 0.16 μm to 0.13 μm can be achieved taking advantage of the Levenson Phaseshift Technique. The Levenson Phaseshift Technique, as is known to those in the art, can be used to produce design patterns smaller than those of the wavelength of the light source by taking advantage of the wave-like characteristics of light. In the cell described herein, an ideal and natural symmetry is employed in the phase shift application. This symmetry, the hexagonal structure, leads to a uniquely balanced interaction between geometries. Because of this balance, the result is an image that is produced with improved contrast and depth of focus. Ultimately, this leads to less defects and improved yields of the circuit.

Turning now to a DRAM embodiment of the present invention, a portion of the mask design for use with the present invention is shown in FIG. 2A having bitline contacts 38 and storage node contacts 32 shown in a hexagonally symmetric pattern. The DRAM (two-cell) unit 100 is depicted from a top view as containing a bitline contact 38 and two storage node contacts 32 in alignment with adjacent DRAM units 100.

Turning to FIG. 2B, the dimensions and symmetry of the DRAM unit 100 (where a unit is a pair of cells) is described in more detail. As is shown by a closeup top view of the hexagonal symmetry, the area dimensions of the DRAM unit 100 can be made to match the standard 8f² per cell design rule area. The storage node contacts 32 form a hexagonal arrangement around the bitline contacts 38. To obtain the values for the length and width of the DRAM unit 100, the value h is used to define the distance between the center of the nearest storage node contact 32 or bitline contact 38, collectively referred to herein as self-aligning contacts, to obtain the distance necessary to achieve isolation for design pattern geometries of 0.16 and 0.13 micrometers. The term "self-aligned contacts" as used herein is used to describe both bitline contacts 38 and storage node contacts 32, and are "aligned" because their position is defined by a single exposure of a single mask, thereby, eliminating the misalignment that occurs between masking operations.

Because the DRAM unit 100 is hexagonally symmetric, the dimensions of the DRAM unit 100 can be calculated based on the internal 60 degree angles of a hexagon. Based on a center-to-center distance labeled h, one obtains a value of h divided by 2 for the diameter of each self-aligned contact, again, based on standard 8f² geometry. Therefore, the individual transistor units 11 and 13 can be defined as having a length that is ³⁄₂ of h, and a width which is the square root of 3, divided 2, times h. The unit cell area for transistor 11 or transistor 13 is, therefore, the square root of 3, divided by 2, times h times ³⁄₂ times h which gives us a cell size of ¾ times the square root of 3 times h times h.

$$\tfrac{3}{4}\sqrt{3} \times h \times h = 8f^2$$

Using design rules for a design pattern having a value of f equal to 0.16 in the 8f² model, and if we equate that to our transistor unit cell 11 or 13 area, we obtain h values for an f of 0.16 of h equals 0.40 micrometers. Turning to the f value of 0.13, we obtain a transistor unit cell 11 or 13 area of h equals 0.32 micrometers.

The self-aligned contact diameter, as explained hereinabove, is h/2 which gives a self-aligned contact diameter for the f value of 0.16 micrometer design lines of about 0.20 micrometers for the self-aligned contact. For the self-aligned contact having an f value of 0.13, the self-aligned contact diameter is about 0.16 micrometers.

SAC radius:

h/2=0.20 um for f=0.16 um h/2=0.16 um for f=0.13 um

Based on these calculations, the area of the self-aligned contacts is actually larger than that of the typical design rule of 8f².

The image realized on the silicon wafer is a Fourier transform of the mask image. In this simple arrangement, the high frequency part of the Fourier transform is smaller and, as a result, the image of the silicon wafer is closer to the image in a reticle, leading to an improvement in device patterning consistency, and therefore, to device performance. Improved consistency in patterning is achieved even when using the smaller design rules for f values of 0.16 and 0.13 micrometers.

Due to the hexagonal arrangement of the self-aligning contacts depicted in FIGS. 2A and 2B, in order for the wordlines 30 to contact the individual bitline contacts 38, instead of having straight wordlines as in the prior art, the wordline 30 of the present invention is designed so as to contact the bitline contacts 38, which are no longer aligned in a straight line.

Wordlines 30 are made as depicted in FIG. 3. In order to maintain the hexagonal symmetry of the DRAM unit 100, the wordline 30 has evenly spaced protrusions 50 that reach out to contact the bitline contact (not depicted) away from the centerline 39 of the wordline 30. In FIG. 3, the protrusions 50 of wordline 30 can be seen to face each other and form a wordline spacing 52 that provides isolation between the different wordlines 30.

In order to conform to the 8f² design rule, we must solve for the values of the width of the wordline spacing 52 and for the size of the protrusions 50. As was seen in FIGS. 2A and 2B, we assume that the diameter of the bitline contact is h/2. Therefore, we calculate that the thickness of the wordline without protrusions 50 to be ³⁄₁₀ of h. Again, based on the 8f² assumption, we find that the wordline spacing 52 also has a width of ³⁄₁₀ h. Returning to our design rule for the 8f² pattern having a width of f equals 0.16, we solve for the f value and determine for f equals 0.16, that h has a value equal to about 0.119 micrometers. Likewise, for an f value of 0.13, the h value is about 0.097 micrometers.

The space 54 between protrusions 50 maintains the symmetry of the wordline spacing 52 and as described above, has a width of ³⁄₁₀ h, again following the 8f² design rule. The length of the protrusion 50, however, in a trapezoidal shape is resolved by the equation:

$$\sqrt{3}/2 * h - \tfrac{3}{10} * h = \text{area}$$

giving us a width for the protrusion 50 based on a 0.16 geometry of about 0.225 micrometers in width. For the design geometry of f equals 0.13, the value for h is about 0.183 micrometers.

Bitline 22 to bitline 22 spacing is double that of the calculations made for the wordlines 30 and the wordline spacing 52, which gives us a length of ⁶⁄₁₀ths of h, which for a $8f^2$ geometry of 0.16 equals to an h value of about 0.238 micrometers. Likewise, for the $8f^2$ geometry of 0.13, the value of h is about 0.194 micrometers.

FIG. 4 shows the design for moat region 14, which for use in this embodiment generally has a rectangular shape. The size of the rectangles can be defined according to the $8f^2$ design rule area. Therefore, we follow the central assumptions for the hexagonally symmetric DRAM unit 100 is that the geometries underlying the different components of the DRAM unit 100 will be assumed to equal that of the $8f^2$ design rule based on an f value of, for example, 0.16 and 0.13 micrometers.

$$\sqrt{3}/4*h = \text{moatwidth/space}$$

To calculate the space occupied by the moat region 14, one can calculate, for example, the width occupied by the width of the rectangular moat shape, which for an f value of 0.16 micrometers will yield a moat to width space area of about 0.17 micrometers. For an $8f^2$ design geometry of f=0.13 micrometers, the moat width per space will be about 0.14 micrometers.

Moat width/space:
=0.17 um for f=0.16 um
=0.14 um for f=0.13 um

As the length of the rectangle is 2½ times the length h, we solve for the value of h, and for the value f having an f—equal to 0.16, yielding a moat region 14 length equal to about 3.993 micrometers. For an $8f^2$ geometry of 0.13, the h value for the length of the rectangular moat region 14 is about 0.807 micrometers. Likewise, the distance measured between the moat region rectangles as they are lined along their length can be calculated to be the square root of the value h. The region between adjacent rectangular lines 44 can be described as the square root of 3, divided by 4, of h. Finally, the distance between the center lines of the rectangular moat regions 14, designated herein as 46, is the square root of 3, divided by 2, of h, using h values as calculated above.

FIG. 5 shows the hexagonal arrangement 60 of the storage node contacts 32. The storage node contacts 32 form part of the self-aligning contacts and are depicted here in the hexagonal arrangement. The storage node contacts 32 and the bitline contacts 38, can be created using one or two masks. When used with Levenson Phaseshift, however, a one mask arrangement is preferred in order to maximize the area used and minimize dark areas.

FIG. 6 shows a top view of storage nodes 36, which also form a hexagonal shape around the bitline contacts 38. The storage node 36, while depicted as triangular in shape, may have alternative shapes, such as generally oval. The storage node contact 32 is shown as being centrally located within the outline of the storage node 36, however, alternative arrangements are possible.

As can be better viewed from the top view showing the storage node 36, in conjunction with the storage node contacts 32 and the bitline contacts 38, one can assume that the masking pattern for the storage node 36 is triangular. In order to obtain the surface area of the storage node 36, again based on the $8f^2$ design rule of geometry, and based on the hexagonal arrangement of the DRAM unit 100, one can assume that the distance between two bitlines contacts 38 is two times h. Based on this geometry, the distance between a bitline contact 38 and the closest edge of a storage node 36 is h divided by 4. As the distance between storage node contacts 38 is two times h, and the minimum distance between a bitline contact 38 and a storage node 36 is h/4, again from a top view, this permits us to have, an isosceles triangle having a per side length of (1 minus the square root of 2 divided by 4) times h.

To calculate the surface area of the surface node 36 based on the side length, we solve for h based on the following equation:

$$(6 - \tfrac{3}{2}\sqrt{3})ht + \sqrt{\tfrac{3}{4}}(1 - \sqrt{\tfrac{3}{4}})^2 h^2$$

Using our $8f^2$ design rule assumption for surface size, and having a goal design pattern of f value equals 0.16, we obtain a surface area of about 0.359 micrometers for the surface area of the storage node 36. Likewise for the design geometry of f equals 0.13, we obtain a surface area of about 0.189 micrometers.

Based on a t value of 0.25 microns and a capacitance density of 76 femtoFarads (fF) per square micrometer, we obtain a capacitance density of 27 fF per cell for the design geometry having a value of f equals 0.16. Likewise for the f value of 0.13 micrometers, we obtain a capacitance density of 22 fF per cell. Using conventional $8f^2$ design rule, the capacitance density value obtained is 21 fF per cell for an f equals 0.16 micrometer geometry. Therefore, using the present invention increases the capacitance value of both the f equals 0.16 and f equals 0.13 design rule geometry.

Figure 7:
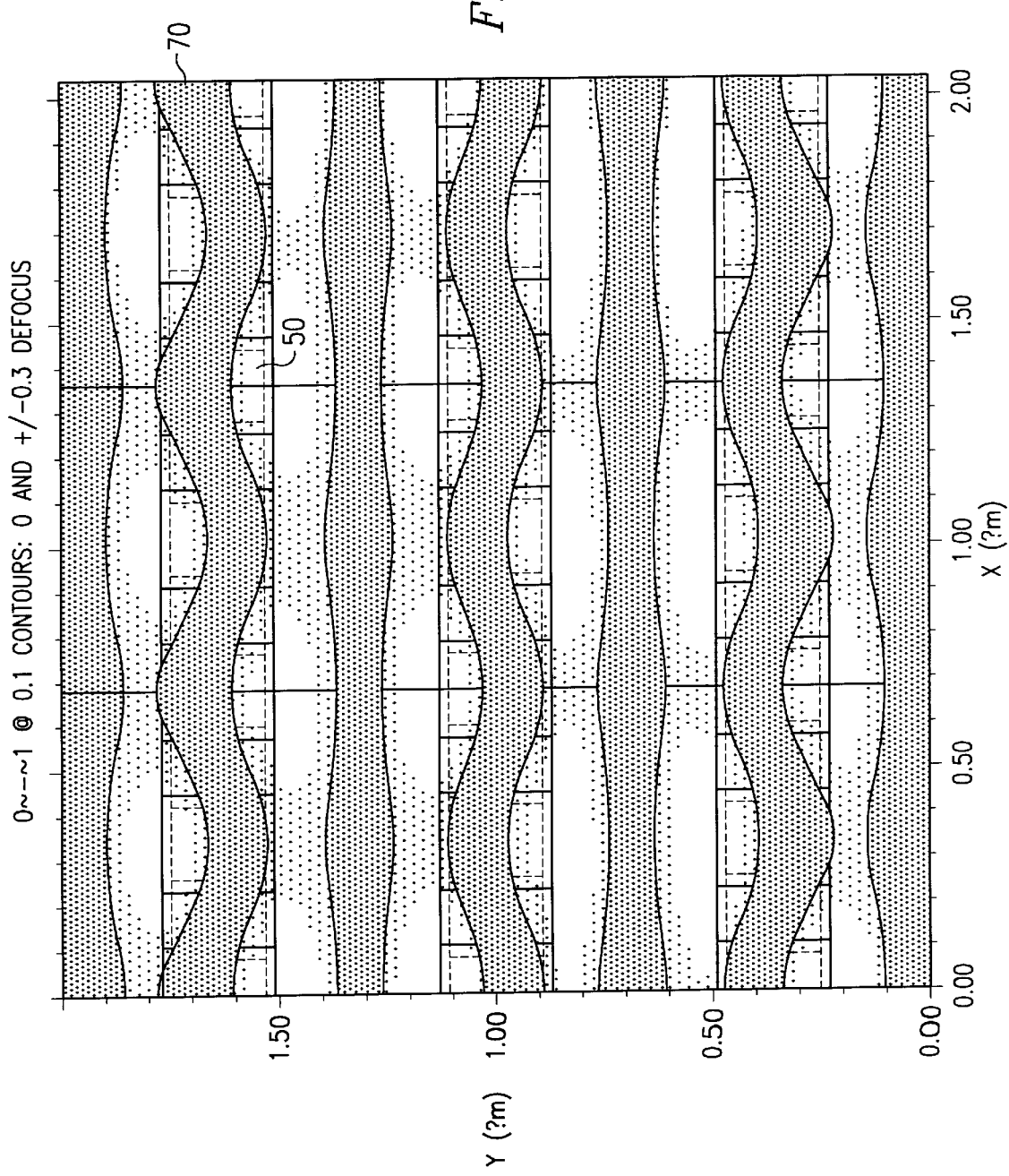
FIG. 7 is top view of the contours for wordlines for DRAM cells deposited on a silicon wafer.

Capacitance:
f=0.16; t=0.25 um=0.359 um$^2$=27 fF/cell
f=0.13; t=0.25 um=0.189 um$^2$=22 fF/cell
8f2 prior art storage node f=0.16=21 fF/cell FIG. 7 shows the contour 70 of wordlines 30 that were made with a mask having square protrusions 50 extending from wordline 30. As can be seen in FIG. 9, the contour 70 on a silicon wafer provides sufficient distance between the alternating protrusions 50 of wordline 30 to provide electrical isolation between the bitline contacts. The contour 70 was created using a Krf laser having a wavelength of 248 mm.

Figure 8:
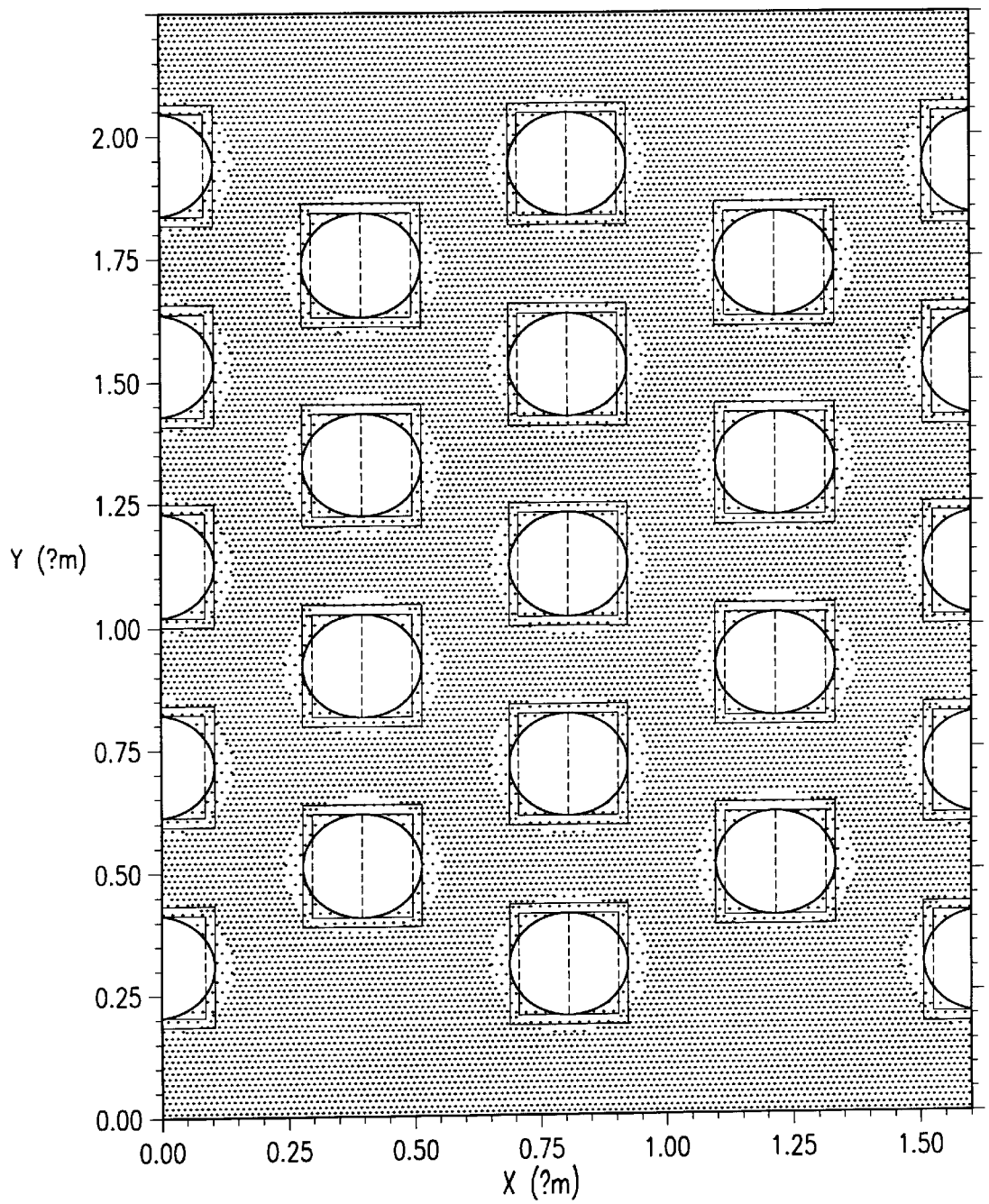
FIG. 8 is a top view of the contours of self aligning contacts for DRAM cells deposited on a silicon wafer.

FIG. 8 shows the hexagonal arrangement of the self aligned contacts, namely, storage node contacts 32 and bitline contacts 38 on a silicon wafer. As with FIG. 7, the pattern was created using a KrF laser having a wavelength of 248 nanometers. The self-aligning contact mask had square areas which form the generally oval contours depicted herein. As can be seen from the contours on the wafer surface, isolation of the self aligned contacts, namely, the storage node contacts 32 and bitline contacts 38 was achieved within the desired tolerances.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A DRAM circuit comprising:
   a field effect transistor having a first source/drain and a second source/drain;
   a bitline electrically connected to said first source/drain by a bitline contact;
   at least six storage node contacts disposed hexagonally surrounding said bitline contact; and
   at least six storage nodes electrically connected to said second source/drain by said at least six storage node contacts.

2. The DRAM circuit of claim 1, further comprising a wordline electrically connected to said field effect transistor, said wordline being disposed at an angle to said bitline.

3. The DRAM circuit of claim 2 wherein said wordline is further defined as comprising:

a centerline extending through said wordline; and protrusions that extend from said centerline to form said transistor gate.

4. The DRAM circuit of claim 1 wherein said storage nodes are hexagonally arranged surrounding said bitline.

5. A DRAM circuit comprising:

a first source/drain;

a bitline electrically connected to said first source/drain by a bitline contact;

at least six storage node contacts disposed hexagonally surrounding said bitline contact;

at least six storage nodes electrically connected to a second source/drain by said at least six storage node contacts; and a wordline electrically connected to a field effect transistor said wordline being disposed at an angle to said bitline;

the area covered by an individual DRAM cell being calculated by the formula $(3/4)(3^{1/2}) \times h \times h = 8f^2$, wherein said f is a design rule value and h is the closest distance between said storage node contacts and said bitline contact.

6. The DRAM circuit of claim 5 wherein the diameter of said bitline is h/2.

7. The DRAM circuit of claim 5 wherein the diameter of said storage node contact is h/2.

8. The DRAM circuit of claim 5 wherein said wordline is further defined as having protrusions with an area calculated by the formula:

$$\sqrt{3}/2 * h - 3/10 * h = \text{area}$$

wherein h is the closest distance between said storage node contacts and said bitline contact.

9. The DRAM circuit of claim 5 wherein said storage node has an area defined by the following formula:

$$(6 - 3\sqrt{3}/2)ht + \sqrt{3}/4(1 - \sqrt{3}/4)^2 h^2$$

wherein h is the closest distance between said storage node contacts and said bitline contact, and t is the dielectric constant for said capacitor.

10. A hexagonally symmetric DRAM circuit on a silicon wafer comprising:

a pair of field effect transistors, each of said transistors having a common first source/drain and a separate gate;

a bitline contact in contact with said source/drain;

a bitline in electrical contact with said bitline contact;

six storage node contacts disposed surrounding said bitline contact; and two wordlines, each said wordline providing a gate for one of said field effect transistors;

one or more storage nodes providing a portion of a capacitor with said storage node contacts.

11. The DRAM circuit of claim 10, wherein said storage nodes are hexagonally arranged surrounding said bitline.

12. The DRAM circuit of claim 10 wherein said wordline is further defined as comprising:

a centerline extending through said wordline; and protrusions that extend from said centerline to form a gate transistor with said moat.

13. A hexagonally symmetric DRAM circuit on a silicon wafer comprising:

a first source/drain;

a bitline contact in contact with said source/drain;

a bitline in electrical contact with said bitline contact;

six storage node contacts disposed surrounding said bitline contact, and simultaneously formed with said bitline contact; and two wordlines forming field effect transistor gates;

one or more storage nodes forming a capacitor with said storage node contacts;

an individual DRAM cell area being calculated by the formula: $(3/4)(3^{1/2}) \times h \times h = 8f^2$, wherein said f is a design rule value and h is the closest distance between said storage node contacts and said bitline contact.

14. The DRAM circuit of claim 13, wherein said storage node area is defined by the following formula:

$$(6 - 3\sqrt{3}/2)ht + \sqrt{3}/4(1 - \sqrt{3}/4)^2 h_2$$

wherein h is the closest distance between said storage node contacts and said bitline contact, and t is the dielectric constant for said capacitor.

15. The DRAM circuit of claim 13 wherein the diameter of said storage node contact is h/2.

16. A hexagonally symmetric DRAM circuit on a silicon wafer comprising:

a first source/drain;

a bitline contact in contact with said source/drain;

a bitline in electrical contact with said bitline contact;

six storage node contacts disposed surrounding said bitline contact, and simultaneously formed with said bitline contact; and two wordlines forming field effect transistor gates;

one or more storage nodes forming a capacitor with said storage node contacts;

wherein the diameter of said bitline is h/2 wherein h is the closest distance between said storage node contacts and said bitline contact.

17. A hexagonally symmetric DRAM circuit on a silicon wafer comprising:

a first source/drain;

a bitline contact in contact with said source/drain;

a bitline in electrical contact with said bitline contact;

six storage node contacts disposed surrounding said bitline contact, and simultaneously formed with said bitline contact; and two wordlines forming field effect transistor gates;

one or more storage nodes forming a capacitor with said storage node contacts;

a centerline extending through said wordline; and protrusions that extend from said centerline to form a transistor gate;

wherein said wordline is further defined as having protrusions with an area calculated by the formula /10*h=area wherein h is the closest distance between said storage node contacts and said bitline contact.

* * * * *